(12) United States Patent
Ishimaru et al.

(10) Patent No.: US 7,821,348 B2
(45) Date of Patent: Oct. 26, 2010

(54) CRYSTAL OSCILLATOR FOR SURFACE MOUNTING

(75) Inventors: Chisato Ishimaru, Saitama (JP); Toshikatsu Makuta, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 150 days.

(21) Appl. No.: 12/321,419

(22) Filed: Jan. 21, 2009

(65) Prior Publication Data

US 2009/0189705 A1     Jul. 30, 2009

(30) Foreign Application Priority Data

Jan. 25, 2008    (JP)               2008-014383
Nov. 10, 2008    (JP)               2008-287532

(51) Int. Cl.
*H03B 5/32*      (2006.01)

(52) U.S. Cl. ................ 331/158; 331/108 C; 331/116 FE

(58) Field of Classification Search ............. 331/108 C, 331/116 FE, 158
See application file for complete search history.

(56) References Cited

U.S. PATENT DOCUMENTS 7,492,231 B2 *    2/2009    Nagatomo et al. .......... 331/158

2008/0012451 A1    1/2008    Mizumura et al.

FOREIGN PATENT DOCUMENTS

JP      2007-142869      6/2007

* cited by examiner

*Primary Examiner*—Robert Pascal
*Assistant Examiner*—James E Goodley
(74) *Attorney, Agent, or Firm*—Carrier, Blackman & Associates, P.C.; Joseph P. Carrier; William D. Blackman

(57) ABSTRACT

A crystal oscillator includes an oscillator circuit, a main body, a first switching circuit, a second switching circuit, and a voltage detecting circuit. The oscillator circuit includes an IC chip including an output circuit and a function circuit. The crystal element includes a first excitation electrode and a second excitation electrode. The main body houses the oscillator circuit and the crystal element and includes a power supply terminal, a ground terminal, an output terminal, and a function terminal. The output terminal is electrically connected to the output circuit and the first excitation electrode via the first switching circuit. The function terminal is electrically connected to the function circuit and the second excitation electrode via the second switching circuit. The first switching circuit and the second switching circuit are operated on the basis of a switching signal from the voltage detecting circuit connected to the power supply terminal.

5 Claims, 6 Drawing Sheets

CRYSTAL OSCILLATOR FOR SURFACE MOUNTING

This application claims priority from Japanese Patent Application No. 2008-014383 filed on Jan. 25, 2008 and Japanese Patent Application No. 2008-287532 filed on Nov. 10, 2008, the entire subject matter of which is incorporated herein by reference.

BACKGROUND OF THE INVENTION

1. Field of the Invention

The invention relates to a technical field for a crystal oscillator for surface mounting (hereinafter called a surface-mounted oscillator), and in particular, to a surface-mounted oscillator whose mounting terminals onto the set substrate are also used as crystal testing terminals.

2. Description of the Related Art

Surface-mounted oscillators are compact and lightweight. Therefore, the surface-mounted oscillators are particularly adopted as reference sources for frequency and time in portable electronic devices. As one of these, there is a surface-mounted oscillator configured such that an IC chip and a crystal element are housed in a case main body, and a crystal testing terminal to measure the vibration characteristics of a crystal unit is provided on the outer surface thereof (for example, refer to JP-A-2007-142869).

FIGS. 6A to 6C and 7 are diagrams for explanation of one related example. FIG. 6A is a front view of a surface-mounted oscillator, which is partially fractured cross-sectionally, FIG. 6B is a schematic bottom view of the same, and FIG. 6C is a plan view of a crystal element. FIG. 7 is a diagram of an oscillator circuit for clock.

The surface-mounted oscillator 200 is configured such that an IC chip 2 and a crystal element 3 are housed in a case main body 1 which is formed to be concave, and a cover 4 is jointed thereto so as to hermetically encapsulate those. The case main body 1 is formed of a laminar ceramic, and for example, has an inner wall shoulder portion on one end side. The four corners of the outer bottom face of the case main body 1 has mounting terminals 5 composed of a power supply terminal 5(Vdd), an output terminal 5(OUT), a ground terminal 5(GND) and a function terminal. Here the function terminal is set as a standby terminal 5(ST).

The IC chip 2 is configured such that an oscillator circuit 6 shown by the dotted frame in FIG. 7 (except for the crystal unit 3A) is integrated, and is composed of an oscillator stage 6a, an output circuit 6b, and a standby circuit 6c serving as a function circuit. The oscillator stage 6a has an oscillating amplifier 7 composed of an inverter element made to be a CMOS, for example, and capacitors C (Ca and Cb) forming a resonant circuit with a crystal unit 3A. Reference code Rf in the drawing is a feedback resistor, and a plurality of reference codes 21 indicated by mark "□" provided on the line of the dotted frame are IC terminals.

The output circuit 6b is configured such that a plurality of buffer amplifiers 8 composed of inverter elements (CMOS or the like) are series-connected to the oscillating amplifier 7, to amplify an oscillating output so as to shape a waveform into a rectangular form, for example. The standby circuit 6c is used in a case in which the surface-mounted oscillator 200 is particularly used for clock, and operates or stops the oscillating amplifier 7 and the buffer amplifiers 8 as needed. Thereby, power consumption is reduced.

In this case, the standby circuit 6c operates on the basis of a control signal (LOW or HIGH) from the standby terminal 5(ST). Then, based on the standby circuit 6c when a control signal from the standby terminal 5(ST) is LOW or HIGH, the oscillating and buffer amplifiers 7 and 8 are operated or stopped.

The circuit functional surface having the IC terminals 21 of the IC chip 2 is fixed to the inner bottom face of the case main body 1 (so-called flip-chip bonding). For example, a metal bump 9 provided to the IC terminals 21 is electrically and mechanically connected to the circuit terminals provided to the inner bottom face of the case main body 1 by ultrasonic thermo-compression bonding or the like. The power source, output, ground, and standby terminals of the IC terminals 21 are electrically connected to respective mounting terminals 5 {5(Vdd), 5(OUT), 5(GND) and 5(ST)} on the outer bottom face of the case main body 1 through wiring routes.

The crystal element 3 has excitation electrodes 10 (10a and 10b) on its both principal surfaces, and for example, extraction electrodes 11 (11a and 11b) are extended on the both sides of one end of the crystal element. Then, the both sides of the one end of the crystal element 3 on which the extraction electrodes 11 (11a and 11b) extend are firmly fixed to a pair of crystal holding terminals (not shown) provided to the inner wall shoulder portion of the case main body 1, with a conductive adhesive 12.

The pair of crystal holding terminals is electrically connected to the crystal terminals of the IC terminals 21 through wiring routes. Then, the pair of crystal holding terminals is electrically connected through the lamination plane to crystal testing terminals 13 provided to the lateral surfaces of the case main body 1 facing each other. Thereby, the excitation electrodes 10 of the crystal element 3 are connected in parallel to, not only the crystal terminals of the IC terminals 21, but also the crystal testing terminals 13.

The cover 4 is jointed to the end face of the opening of the case main body 1 by seam welding or the like, to hermetically encapsulate the IC chip 2 and the crystal element 3. Then, a probe out of a measuring apparatus (not shown) is made to contact the crystal testing terminals 13 of the case main body 1, to test the vibration characteristics including a crystal impedance (CI) and the like of the crystal unit. Note that, because the vibration characteristics vary due to stress and the like at the time of joining the cover 4, the vibration characteristics after encapsulating with the cover are to be tested.

However, in the related surface-mounted oscillator 200 having the above-described configuration, in particular, the more the downsizing thereof is advanced, for example, as the planar outline thereof comes to be 2.0×1.6 mm or less, the areas of the crystal testing terminals 13 become smaller. Thus, it makes more difficult to contact the probe of the measuring apparatus to the crystal testing terminals 13. Further, because the crystal testing terminals 13 have essentially no need for an operation of the surface-mounted oscillator 200, and the case main body 1 has the crystal testing terminals 13 on its lateral surfaces, they may be a cause for generating floating capacitance, which may produce a problem exerting an effect on an oscillating frequency.

SUMMARY OF THE INVENTION

An object of the invention is to provide a surface-mounted oscillator whose mounting terminals are also used as crystal testing terminals in order to reduce a size of the surface-mounted oscillator.

According to a first aspect of the invention, there is provided a crystal oscillator for surface mounting, the crystal oscillator comprising: an oscillator circuit comprising: an IC chip comprising an output circuit and a function circuit; and a crystal element comprising: a first excitation electrode on a first surface thereof; and a second excitation electrode on a second surface thereof, which is opposite to the first surface; a main body, which houses the oscillator circuit and the crystal element such that at least the crystal element is hermetically encapsulated therein, and which comprises a plurality of mounting terminals on an outer bottom face thereof, the plurality of mounting terminals comprising: a power supply terminal; a ground terminal; an output terminal; and a function terminal; a first switching circuit that is electrically connected to the output terminal; a second switching circuit that is electrically connected to the function terminal; and a voltage detecting circuit that is connected to the power supply terminal, wherein the output terminal is electrically connected to the output circuit and the first excitation electrode via the first switching circuit, wherein the function terminal is electrically connected to the function circuit and the second excitation electrode via the second switching circuit, and wherein the first switching circuit and the second switching circuit are operated on the basis of a switching signal from the voltage detecting circuit connected to the power supply terminal.

According to a second aspect of the invention, in the crystal oscillator for surface mounting according to the first aspect, when a normal power supply voltage for operating the oscillator circuit is applied to the power supply terminal, the switching signal from the voltage detecting circuit causes the output circuit and the function circuit to electrically connect to the output terminal and the function terminal, and when a voltage higher than the power supply voltage is applied to the power supply terminal, the switching signal from the voltage detecting circuit causes the first excitation electrode and the second excitation electrode to electrically connect to the output terminal and the function terminal.

According to a third aspect of the invention, in the crystal oscillator for surface mounting according to the first aspect, the function circuit is a standby circuit.

According to a fourth aspect of the invention, in the crystal oscillator for surface mounting according to the first aspect, the function circuit is a voltage control circuit.

According to a fourth aspect of the invention, in the crystal oscillator for surface mounting according to the first aspect, the IC chip further comprises the first switching circuit, the second switching circuit and the voltage detecting circuit.

According to the aspects of the invention, since the output terminal and the function terminal may be connected by the first and second switching circuits, the output terminal and the function terminal may also be used as crystal testing terminals to test the vibration characteristics of a crystal unit. Then, by connecting the output terminal and the function terminal to the output circuit and the function circuit by the first and second switching circuits, they may function as an output terminal and a function terminal normally.

According to the second aspect, given that a normal power supply voltage for operating the oscillator circuit is 3.3V, when a voltage of 5V greater than 3.3V is applied to the power supply terminal, the output terminal and the function terminal may be used as a pair of crystal testing terminals. Then, at the normal power supply voltage of 3.3V, the output terminal is connected to the output circuit and the function circuit is connected to the function terminal, and the both function normally.

According to the third aspect and the fourth aspect, the function circuit is specified, and the crystal oscillator to be an object of the invention is for clock or for voltage control.

BRIEF DESCRIPTION OF THE DRAWINGS

FIGS. 1A to 1C are diagrams for explanation of a crystal oscillator according to the invention, in which FIG. 1A is a front view of a crystal oscillator according to the invention, which is partially fractured cross-sectionally, FIG. 1B is a bottom view of the crystal oscillator, and FIG. 1C is a plan view of a crystal element of the crystal oscillator;

FIGS. 6A to 6C are diagrams for explanation of a related surface-mounted oscillator, in which FIG. 6A is a partial front sectional view of the related surface-mounted oscillator, FIG. 6B is a schematic bottom view of the related surface-mounted oscillator, and FIG. 6C is a plan view of a crystal element of the related surface-mounted oscillator.

DETAILED DESCRIPTION OF THE PREFERRED EMBODIMENTS

Hereinafter, embodiments of a surface-mounted oscillator according to the invention will now be described with reference to the drawings.

Figure 1A:
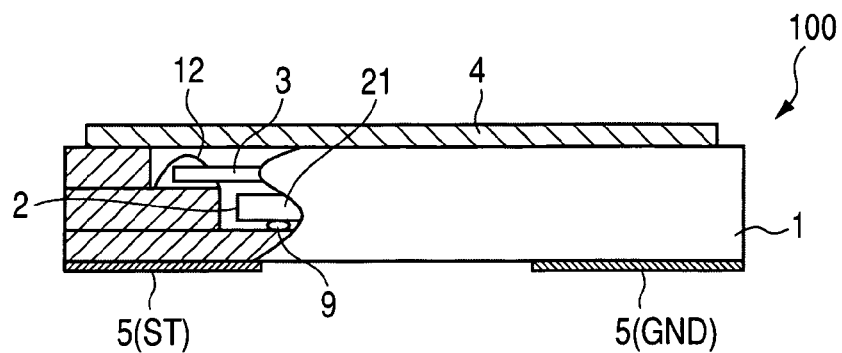
Figure 1B:
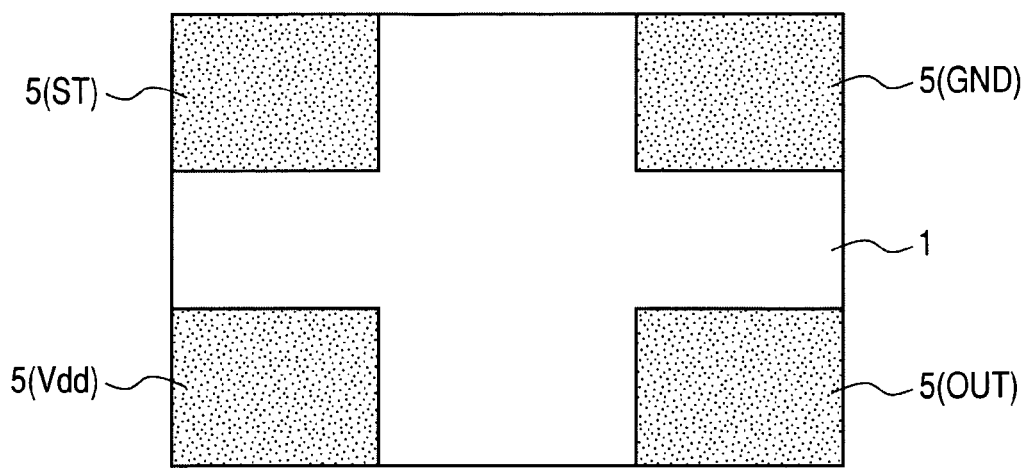
Figure 1C:
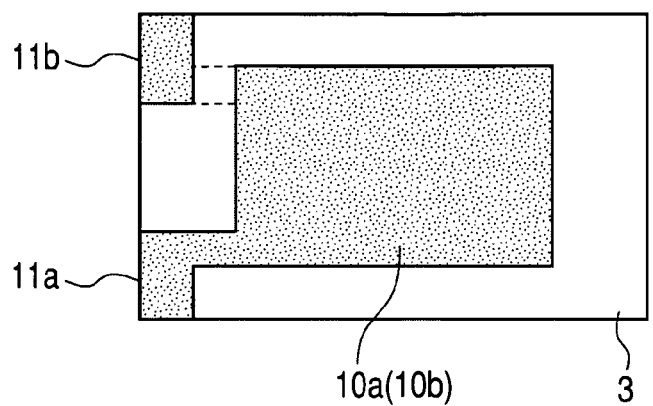
Figure 2:
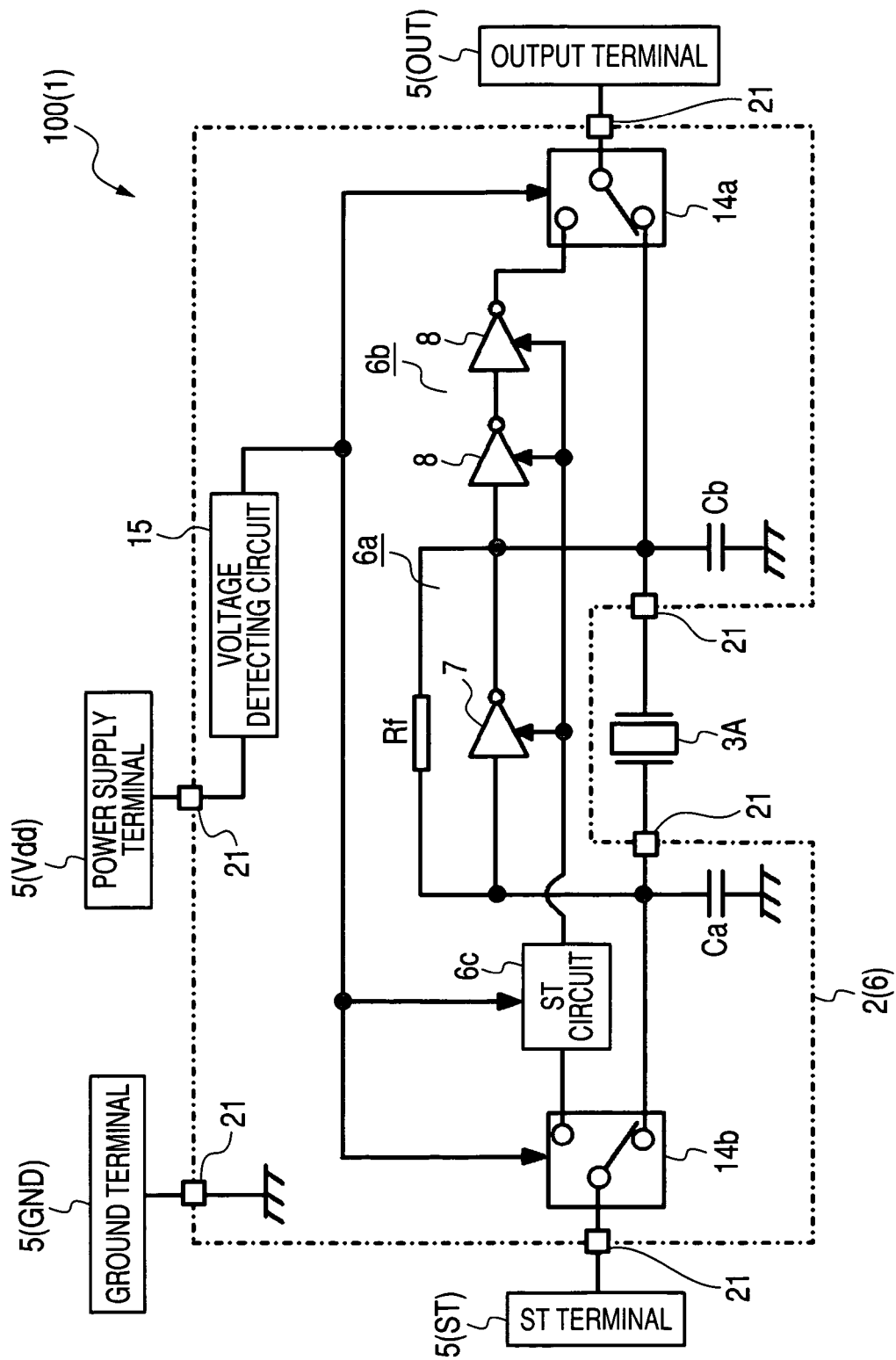
FIG. 2 is a circuit diagram of a crystal oscillator made for clock for explanation of one embodiment of the invention.

FIG. 1 is a partial front sectional view of a crystal oscillator according to the invention. FIG. 2 is a circuit diagram of a crystal oscillator made for clock for explanation of one embodiment of the invention. Note that portions which are the same as those in the related example are denoted by the same numbers, and descriptions thereof will be simplified or omitted.

As shown in FIGS. 1A to 1C and FIG. 2, the crystal oscillator 100 according to the invention is configured such that the IC chip 2 and the crystal element 3 are housed in the case main body 1, which is formed to be concave and which has the mounting terminals 5 on the four corners of the outer bottom face. The cover 4 is jointed to the case main body 1 so as to hermetically encapsulate the IC chip 2 and the crystal element 3. The mounting terminals 5 are composed of a power supply terminal 5(Vdd), an output terminal 5(OUT), a ground terminal 5(GND), and a standby terminal 5(ST) serving as a function terminal.

The oscillating stage 6a, the output circuit 6b and the standby circuit 6c serve as the oscillator circuit 6 except for the crystal unit 3A and are integrated into the IC chip 2. The standby circuit serves as a function unit. The IC chip 2 is flip-chip bonded onto the inner bottom face of the case main body 1. The power source, output, ground, and standby terminals of the IC terminals 21 are electrically connected to the mounting terminals 5 {5(Vdd), 5(OUT), 5(GND) and 5(ST)} corresponding thereto on the outer bottom face of the case main body 1. The both sides of the one end of the crystal element 3 on which the extraction electrodes 11 extend from the excitation electrodes 10 (a first excitation electrode 10a and a second excitation electrode 10b) are firmly fixed to the inner wall shoulder portion of the case main body 1 with the conductive adhesive 12.

In this embodiment, the output terminal 5(OUT) of the mounting terminals 5 connected to the output circuit 6b of the oscillator circuit 6 is electrically connected to the first excitation electrode 10a (the extraction electrode 11a) of the crystal element 3 serving as one terminal of the crystal unit 3A via a first switching circuit 14a. That is, the output terminal 5(OUT) is electrically connected to, not only the output circuit 6b, but also the first excitation electrode 10a (the one terminal of the crystal unit 3A) of the crystal element 3 through the first switching circuit 14a.

Further, the standby terminal 5(ST) of the mounting terminals 5 connected to the standby circuit 6c serving as a function circuit is electrically connected to the second excitation electrode 10b (the extraction electrode 11b) of the crystal element 3 serving as the other terminal of the crystal unit 3A via a second switching circuit 14b. That is, the standby terminal 5(ST) is electrically connected to, not only the standby circuit 6c, but also the second excitation electrode 10b (the other terminal of the crystal unit 3A) through the second switching circuit 14b.

The first and second switching circuits 14 (14a and 14b) are operated on the basis of a switching signal from a voltage detecting circuit 15 connected to the power supply terminal 5(Vdd). The voltage detecting circuit 15 detects a voltage applied to the power supply terminal 5(Vdd). In this case, given that a rated power supply voltage for operating the oscillator circuit 6 is 3.3V for example, the voltage detecting circuit 15 is operated with a switching voltage which is, for example, 4.5V higher than 3.3V. Then, for example, when the power supply voltage is higher than 4.5V, the voltage detecting circuit 15 outputs a switching signal set as HIGH (1 signal), and when the power supply voltage is less than or equal to 4.5V, the voltage detecting circuit 15 outputs a switching signal set as LOW (0 signal). The switching signals are applied to, not only the first and second switching circuits 14 (14a and 14b), but also the standby circuit 6c. The first and second switching circuits 14 (14a and 14b) and the voltage detecting circuit 15 are also integrated into the IC chip 2.

Figure 3:
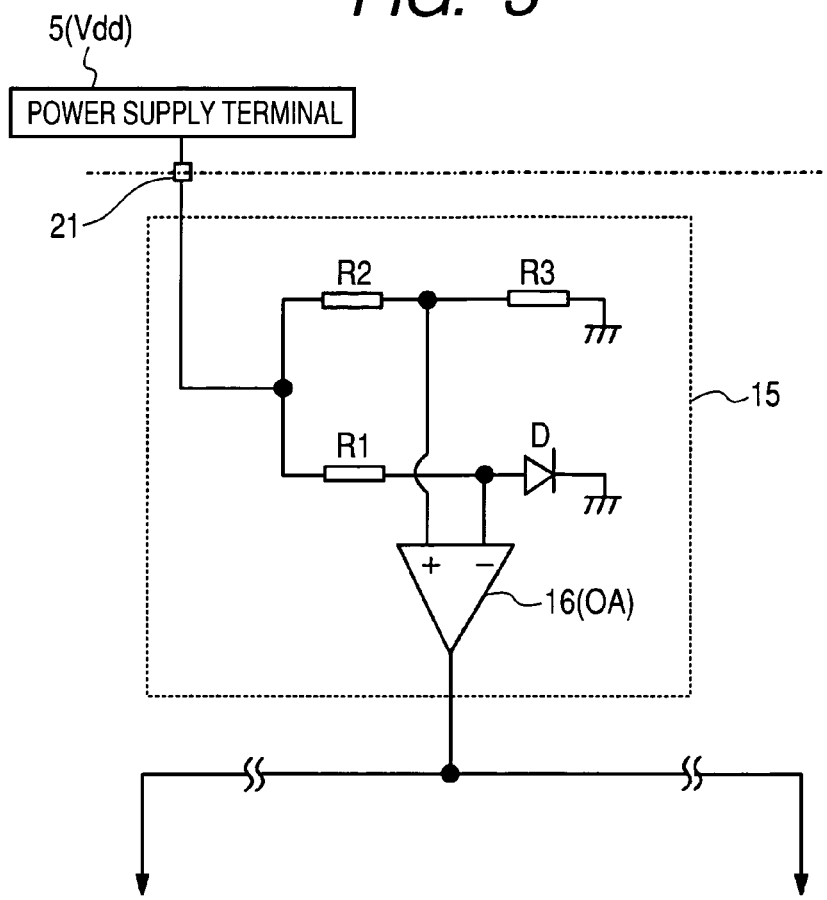
FIG. 3 is a detailed circuit example of a voltage detecting circuit for explanation of the embodiment of the invention.

FIG. 3 is a detailed circuit example of the voltage detecting circuit 15. That is, the voltage detecting circuit 15 has a comparator 16 composed of an operational amplifier OA having two input terminals of ± and one output terminal. Then, a power supply voltage (Vdd) from the power supply terminal 5 is set to a constant voltage, for example, 0.8V by a diode D through a resistor R1. "Curve Vref in FIG. 4A." Then, the constant voltage is set as a reference voltage Vref (0.8V) to be applied to the − input terminal of the operational amplifier OA.

Figure 4A:
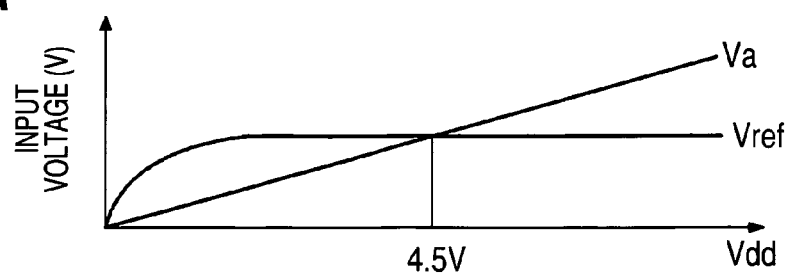
FIGS. 4A and 4B are characteristics diagrams of the voltage detecting circuit for explanation of the embodiment of the invention.
Figure 4B:
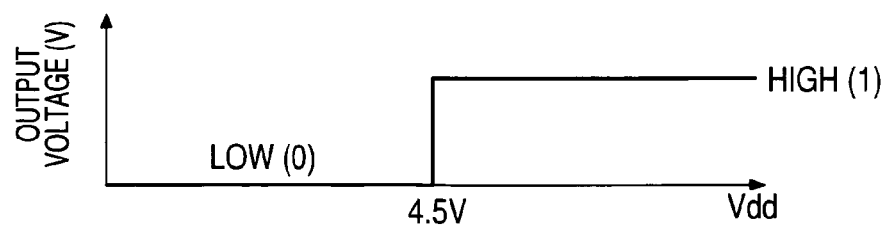

Further, a comparison voltage Va that is an "Upward-sloping straight line Va in FIG. 4A" by voltage dividing resistors R2 and R3 from the power supply voltage Vdd is applied to the + input terminal. Note that the straight line Va in FIG. 4A is the voltage characteristics with respect to the power supply voltage Vdd when a resistance ratio between the voltage dividing resistors R2 and R3 is set to be constant. Here an intersection point of the reference voltage Vref and the comparison voltage Va is set as the aforementioned switching voltage (4.5V) on the basis of the resistance ratio. Thereby, the comparator 15 outputs HIGH (1 signal) to the output terminal when the power supply voltage Vdd is higher than the rated voltage of 3.3V, for example, 5V, and outputs LOW (0 signal) when the power supply voltage Vdd is less than or equal to 3.3V.

In this case, when the switching signal is LOW, the first switching circuit 14a connects the output terminal 5(OUT) to the output circuit 6b, and the second switching circuit 14b connects the standby terminal 5(ST) to the standby circuit 6c. Then, when the switching signal is HIGH, the first switching circuit 14a connects the output terminal 5(OUT) to the one terminal (the first excitation electrode 10a of the crystal element 3), and connects the standby terminal 5(ST) to the other terminal (the second excitation electrode 10b) of the crystal unit 3A.

In such an oscillator, for example, after the IC chip 2 and the crystal element 3 are housed in the case main body 1 to be hermetically encapsulated, a voltage of 5V higher than the switching voltage (4.5V) is applied to the power supply terminal 5(Vdd) to make the switching signal serving as an output from the voltage detecting circuit 15 HIGH. Thereby, the first and second switching circuits 14 (14a and 14b) are operated to connect the output terminal 5(OUT) and the standby terminal 5(ST) to the pair of terminals of the crystal unit 3A "the pair of excitation electrodes 10 (10a and 10b) of the crystal element 3." Then, in this state, the probe from the measuring apparatus is made to contact the output terminal 5(OUT) and the standby terminal 5(ST) to test the vibration characteristics of the crystal unit 3A. In this case, the switching signal (HIGH) is applied to the standby circuit 6c as well to stop the operation of the oscillating amplifier 7.

Further, when the terminals are mounted on the set substrate after testing the vibration characteristics, a rated power supply voltage of 3.3V less than or equal to the switching voltage (4.5V) is applied to the power supply terminal 5(Vdd). In this case, the voltage detecting circuit 15 sets the switching signal as an output LOW on the basis of the voltage less than or equal to the switching voltage of 4.5V, and applies it to the first and second switching circuits 14 (14a and 14b). Accordingly, the first and second switching circuits 14 (14a and 14b) switch and connect the output terminal 5(OUT) to the output circuit 6b and the standby terminal 5(ST) to the standby circuit 6c respectively. Thereby, when the rated power supply voltage of 3.3V is applied, the oscillator circuit 6 operates normally. In this case, because the switching signal applied to the standby circuit 6c is LOW (0 signal), the oscillator circuit 6 operates normally. That is, the oscillator circuit 6 operates on the basis of a signal from the mounting terminal 5(ST).

In accordance with such a configuration, the first and second switching circuits 14 (14a and 14b) connect the output terminal 5(OUT) and the standby terminal 5(ST) to the pair of terminals of the crystal unit 3A of "the pair of excitation electrodes 10 (10a and 10b) of the crystal element 3," to use the output terminal 5(OUT) and the standby terminal 5(ST) as crystal testing terminals as well. Accordingly, there is no need to provide the crystal testing terminals 13 independently to the lateral surface of the case main body 1 as a related example, which makes it possible to advance the downsizing of the surface-mounted oscillator.

(Modifications)

In the above-described embodiment, when an output from the voltage detecting circuit 15 is HIGH, the output terminal 5(OUT) and the standby terminal 5(ST) are connected to the pair of terminals of the crystal unit 3A. Alternatively, even when an output from the voltage detecting circuit 15 is LOW, the output terminal 5(OUT) and the standby terminal 5(ST) may be connected to the pair of terminals of the crystal unit 3A. Further, in the above-described embodiment the switching voltage is set to 4.5V. Alternatively, the switching voltage may be basically greater than or equal to the power supply voltage Vdd.

Figure 5:
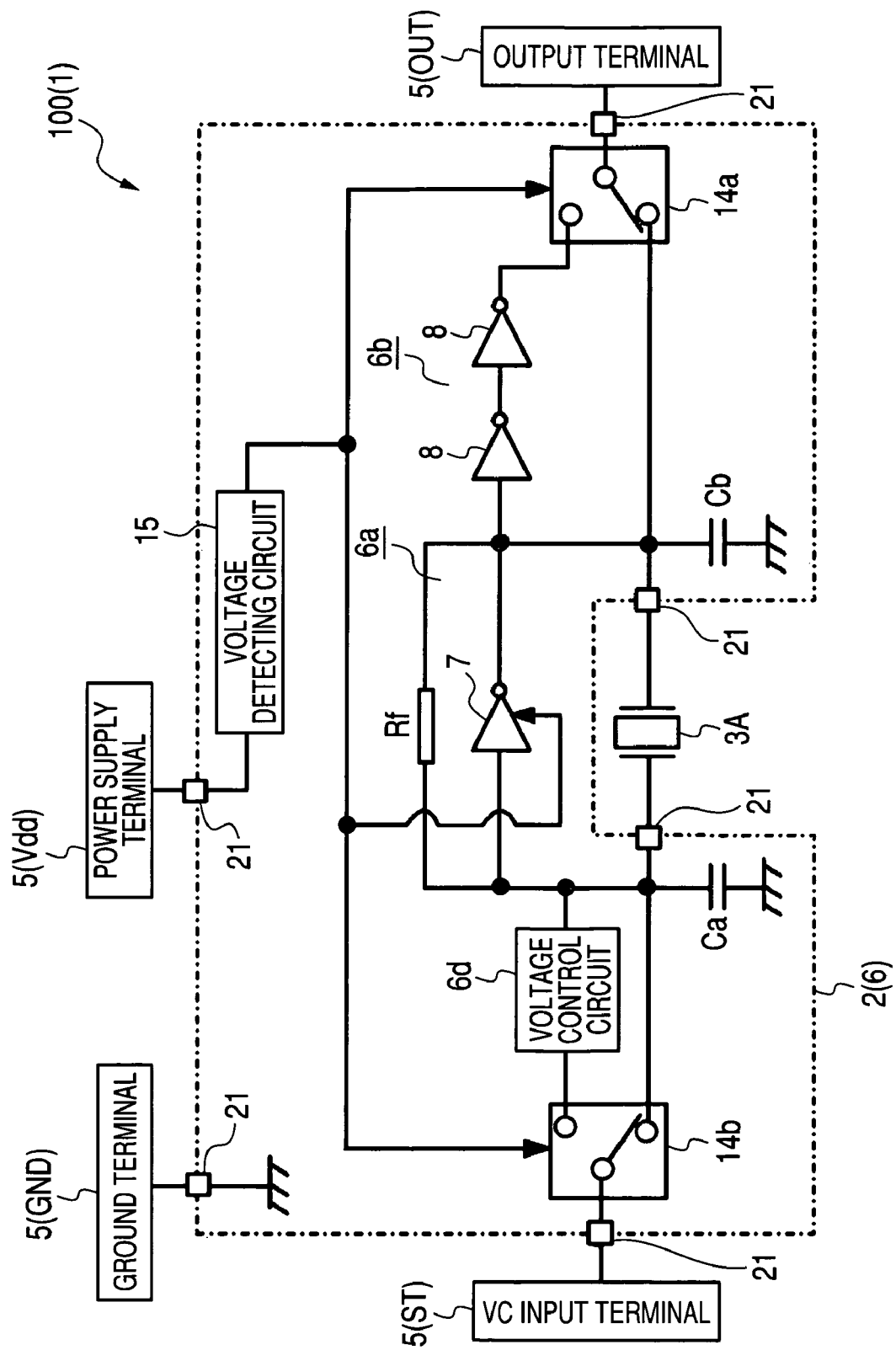
FIG. 5 is a circuit diagram of a crystal oscillator made for voltage control according to a modified embodiment of the invention.
Figure 6A:
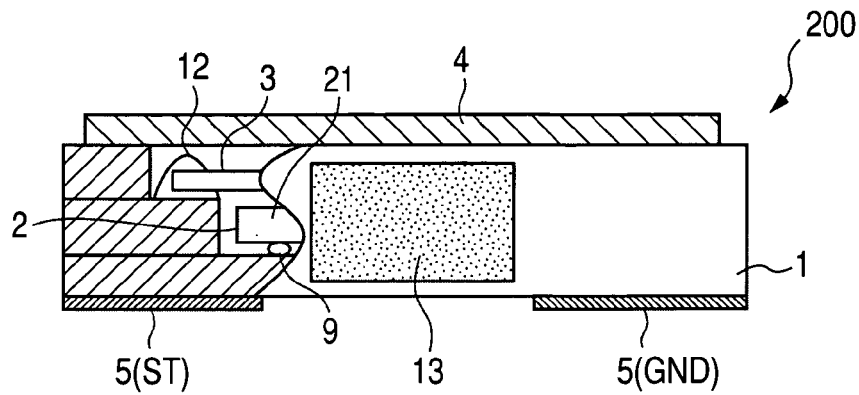
Figure 6B:
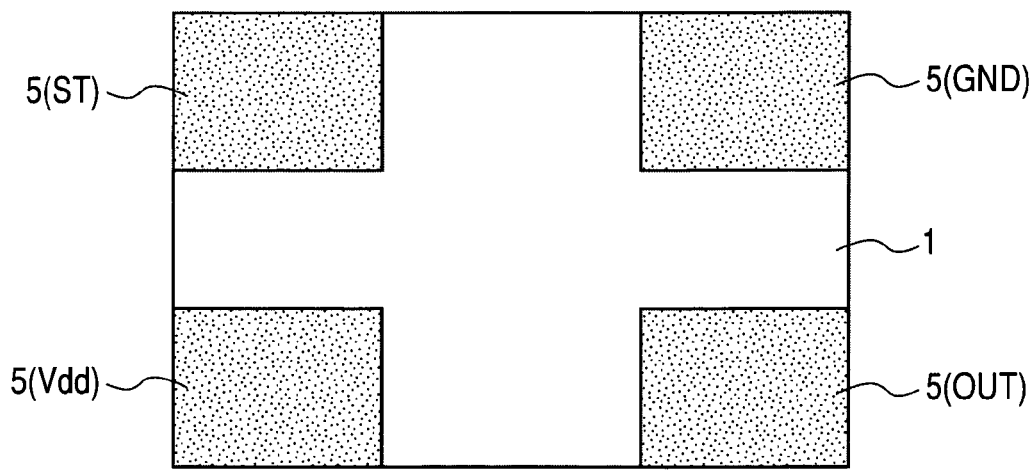
Figure 6C:
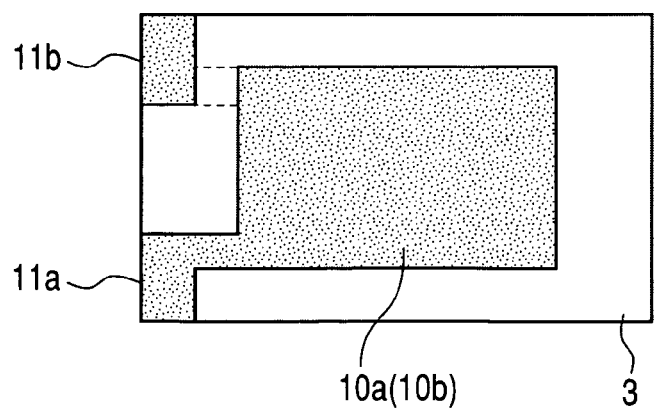
Figure 7:
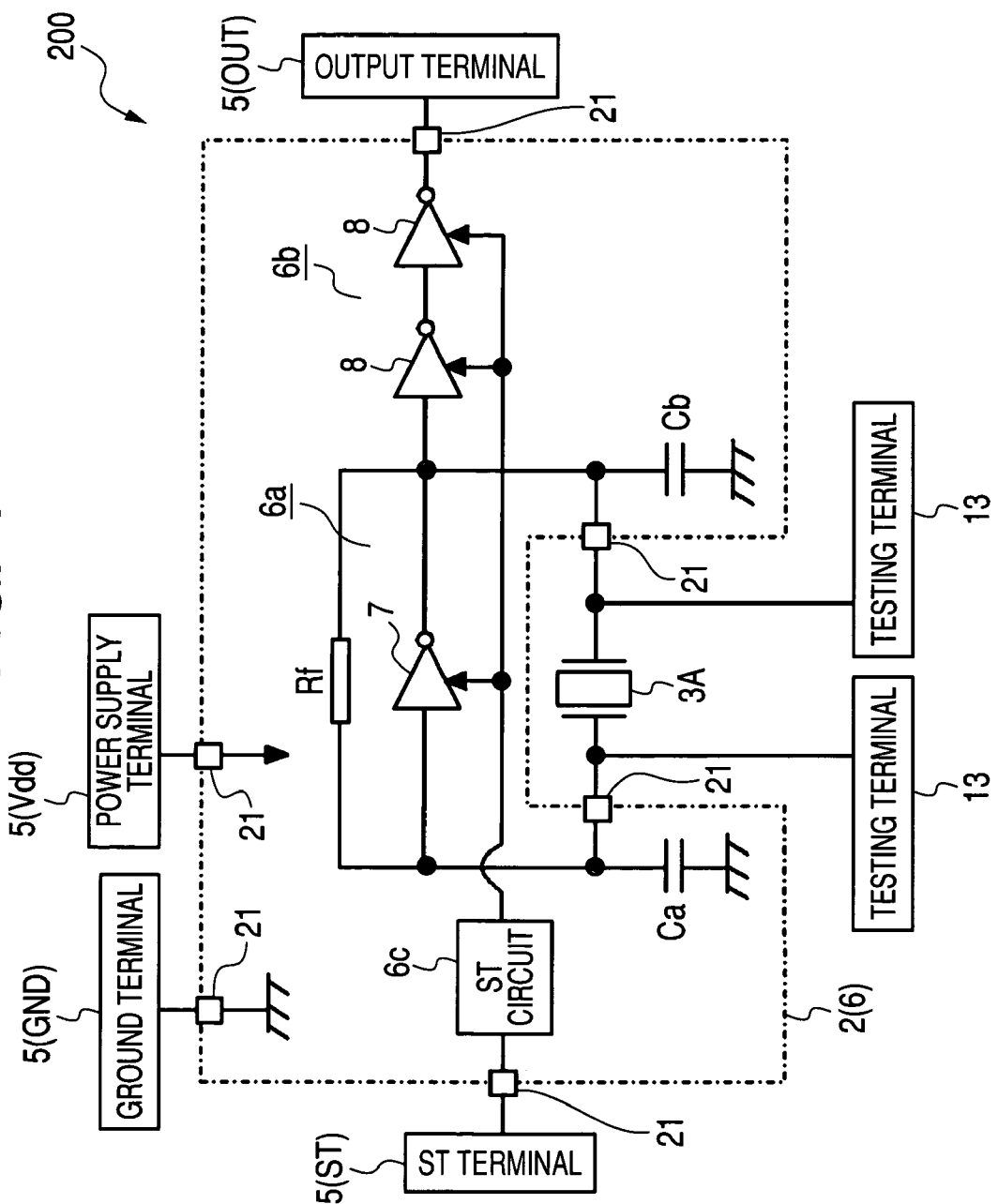
FIG. 7 is a circuit diagram of a crystal oscillator made for clock for explanation of the related example.

Further, in the above-described embodiment, the oscillator circuit is made for clock, and the function circuit is set as the standby circuit 6c. Alternatively, for example, as shown in FIG. 5, the oscillator circuit may be made for voltage control, and the function circuit may be set as a voltage control circuit 6d. In this case, when a switching signal from the voltage detecting circuit 15 is HIGH (1 signal), the operation of the oscillating amplifier 7 is stopped. The voltage control circuit 6d includes a voltage variable capacitative element and the like, and when a control voltage Vc is input thereto from its input terminal, a load capacitance is changed to vary an oscillating frequency along with the change. Incidentally, the function circuit may be any one other than those, in which the mounting terminals 5 connected to the function circuit can be switched by the switching circuits 14.

What is claimed is:

1. A crystal oscillator for surface mounting, the crystal oscillator comprising:
   an oscillator circuit comprising:
      an IC chip comprising an output circuit and a function circuit; and
      a crystal element comprising:
         a first excitation electrode on a first surface thereof; and
         a second excitation electrode on a second surface thereof, which is opposite to the first surface;
   a main body, which houses the oscillator circuit and the crystal element such that at least the crystal element is hermetically encapsulated therein, and which comprises a plurality of mounting terminals on an outer bottom face thereof, the plurality of mounting terminals comprising:
      a power supply terminal;
      a ground terminal;
      an output terminal; and
      a function terminal;
   a first switching circuit that is electrically connected to the output terminal;
   a second switching circuit that is electrically connected to the function terminal; and
   a voltage detecting circuit that is connected to the power supply terminal,
   wherein the output terminal is electrically connected to the output circuit and the first excitation electrode via the first switching circuit,
   wherein the function terminal is electrically connected to the function circuit and the second excitation electrode via the second switching circuit, and
   wherein the first switching circuit and the second switching circuit are operated on the basis of a switching signal from the voltage detecting circuit connected to the power supply terminal.

2. The crystal oscillator for surface mounting according to claim 1,
   wherein, when a normal power supply voltage for operating the oscillator circuit is applied to the power supply terminal, the switching signal from the voltage detecting circuit causes the output circuit and the function circuit to electrically connect to the output terminal and the function terminal, and
   wherein, when a voltage higher than the power supply voltage is applied to the power supply terminal, the switching signal from the voltage detecting circuit causes the first excitation electrode and the second excitation electrode to electrically connect to the output terminal and the function terminal.

3. The crystal oscillator for surface mounting according to claim 1,
   wherein the function circuit is a standby circuit.

4. The crystal oscillator for surface mounting according to claim 1,
   wherein the function circuit is a voltage control circuit.

5. The crystal oscillator for surface mounting according to claim 1,
   wherein the IC chip further comprises the first switching circuit, the second switching circuit and the voltage detecting circuit.

* * * * *